(12) United States Patent
Chang et al.

(10) Patent No.: US 9,269,824 B1
(45) Date of Patent: Feb. 23, 2016

(54) THIN FILM TRANSISTOR AND MANUFACTURING METHOD THEREOF

(71) Applicant: Chunghwa Picture Tubes, LTD., Taoyuan County (TW)

(72) Inventors: Hsi-Ming Chang, Taoyuan County (TW); Yen-Yu Huang, Taoyuan County (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 0 days.

(21) Appl. No.: 14/548,288

(22) Filed: Nov. 20, 2014

(30) Foreign Application Priority Data

Oct. 1, 2014 (TW) .............................. 103134213 A

(51) Int. Cl.
*H01L 21/02* (2006.01)
*H01L 29/786* (2006.01)
*H01L 29/66* (2006.01)
*H01L 21/46* (2006.01)

(52) U.S. Cl.
CPC ...... *H01L 29/7869* (2013.01); *H01L 21/02565* (2013.01); *H01L 21/02664* (2013.01); *H01L 21/46* (2013.01); *H01L 29/66969* (2013.01); *H01L 29/78606* (2013.01)

(58) Field of Classification Search
CPC ..................... H01L 29/7869; H01L 29/66969; H01L 29/78606; H01L 21/02565; H01L 21/02664; H01L 21/46
See application file for complete search history.

(56) References Cited

FOREIGN PATENT DOCUMENTS

TW  201006022  2/2012
TW  201308604  2/2013

*Primary Examiner* — Long Pham
(74) *Attorney, Agent, or Firm* — Jianq Chyun IP Office

(57) ABSTRACT

A thin film transistor disposed on a substrate, includes a gate, a gate insulation layer, a first source/drain, a semiconductor layer and a second source/drain. The gate is disposed on the substrate. The gate insulation layer covers the gate and the substrate. The first source/drain is disposed on the gate insulation layer. The semiconductor layer is disposed above the gate, extends from the gate insulation layer to the first source/drain, and includes a first portion disposed on the first source/drain and a second portion connected to the first portion. An electrical conductivity of the first portion is higher than that of the second portion. The second source/drain covers and is in contact with the second portion. A manufacturing method of thin film transistor is further provided.

6 Claims, 15 Drawing Sheets

THIN FILM TRANSISTOR AND MANUFACTURING METHOD THEREOF

CROSS-REFERENCE TO RELATED APPLICATION

This application claims the priority benefit of Taiwan application serial no. 103134213, filed on Oct. 1, 2014. The entirety of the above-mentioned patent application is hereby incorporated by reference herein and made a part of this specification.

BACKGROUND

1. Field of the Invention

The invention is directed to a thin film transistor and a manufacturing method thereof and more particularly, to a thin film transistor having a semiconductor layer with better mobility and a manufacturing method thereof.

2. Description of Related Art

FIG. 1 is a schematic diagram showing a pixel structure of the related art. Referring to FIG. 1, a conventional pixel structure 1 includes a thin film transistor 10 and a pixel electrode 20. The thin film transistor 10 is disposed on a substrate 2 and includes a gate 11, a gate insulation layer 12, a source 13, a semiconductor layer 14, a dielectric layer 15, a drain 16 and a protecting layer 17. The gate 11 is disposed on the substrate 2, and the gate insulation layer 12 covers the gate 11 and the substrate 2. The source 13 is disposed on the gate insulation layer 12. The semiconductor layer 14 is disposed above the gate 11, extends from the gate insulation layer 12 to the source 13. The dielectric layer 15 covers the source 13, the gate insulation layer 12 and the semiconductor layer 14 and has a first contact window 15a. The drain 16 is disposed on the dielectric layer 15 and contacts the semiconductor layer 14 through the first contact window 15a. The protecting layer 17 covers the dielectric layer 15 and the drain 16 and has a second contact window 17a, and the pixel electrode 20 contacts the drain 16 through the second contact window 17a.

As shown in FIG. 1, during a process of manufacturing the pixel structure 1, the source 13 is manufactured before the semiconductor layer 14 is formed, and the drain 16 is manufactured after the semiconductor layer 14 is formed, and thus, the semiconductor layer 14 does not contact etchant used for patterning the source 13 and the drain 16 and has good thin film quality. Additionally, in the pixel structure 1, the source 13 is separated from the drain 16 with the semiconductor layer 14 disposed therebetween, and thus, a distance between the source 13 and the drain 16 can be shortened, so as to improve element characteristics (e.g., an aperture ratio, a display resolution and so on) of the thin film transistor 10.

However, in the pixel structure 1, part of the semiconductor layer 14 (e.g., region X shown in FIG. 1) is above the source 13. When a turn-on voltage (i.e., a high voltage) is applied to the gate 11, the gate 11, theoretically, generates an electric field to turn on the semiconductor layer 14. However, due to part of the electric field being shielded by the source 13, the part of the semiconductor layer 14 (i.e., the region X) distributed on the source 13 is affected by the shielding effect and may hardly be turned on. As a result, mobility of the semiconductor layer 14 of the thin film transistor 10 becomes poor.

Accordingly, how to improve the issue of poor mobility of the semiconductor layer 14 in the thin film transistor 10 has become one of the problems to be solved.

SUMMARY

The invention provides a thin film transistor whose semiconductor layer has better mobility.

The invention provides a manufacturing method of a thin film transistor which manufactures a thin film transistor having a semiconductor layer with better mobility.

The invention is directed to a thin film transistor, adapted to be disposed on a substrate and including a gate, a gate insulation layer, a first source/drain, a semiconductor layer and a second source/drain. The gate is disposed on the substrate. The gate insulation layer covers the gate and the substrate. The first source/drain is disposed on the gate insulation layer. The semiconductor layer is disposed above the gate, extends from the gate insulation layer to the first source/drain and includes a first portion disposed on the first source/drain and a second portion connected with the first portion. An electrical conductivity of the first portion is higher than an electrical conductivity of the second portion. The second source/drain covers and contacts the second portion.

The invention is directed to a manufacturing method of a thin film transistor, including following steps: forming a gate on a substrate; forming a gate insulation layer on the substrate to cover the gate; forming a first source/drain on the gate insulation layer; forming a semiconductor material layer on the gate insulation layer and the first source/drain, where the semiconductor material layer is located above the gate; forming a second source/drain on the semiconductor material layer and the gate insulation layer; and increasing an electrical conductivity of the semiconductor material layer located on the first source/drain to form a semiconductor layer. The semiconductor layer includes a first portion located on the first source/drain and a second portion connected with the first portion, and an electrical conductivity of the first portion is higher than an electrical conductivity of the second portion.

In light of the foregoing, during the process of manufacturing the thin film transistor, the electrical conductivity of the semiconductor layer on the first source/drain of the invention is increased, which facilitates in enhancing the mobility of the semiconductor layer.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A' is a schematic top view of FIG. 3A.

FIG. 3C' is a schematic top view of FIG. 3C.

DESCRIPTION OF EMBODIMENTS

Figure 1:
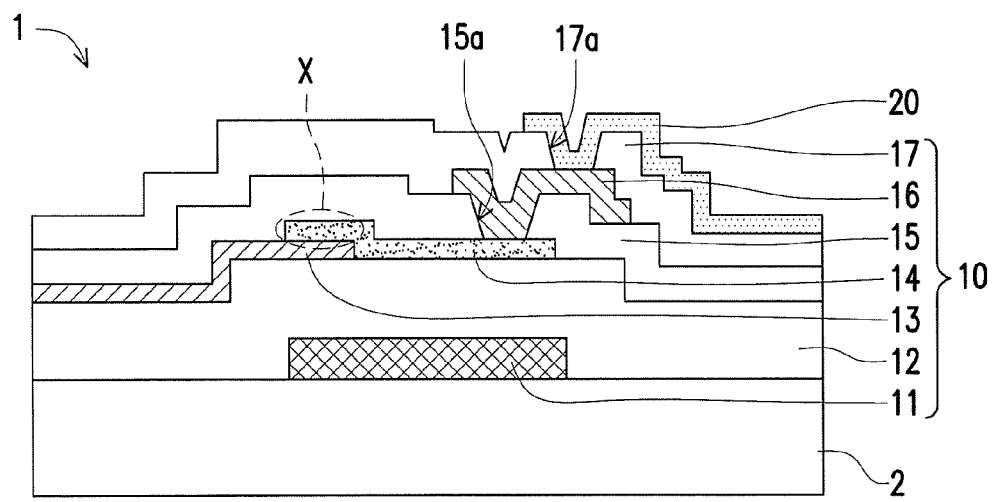
FIG. 1 is a schematic diagram showing a pixel structure of the related art.
Figure 2A:
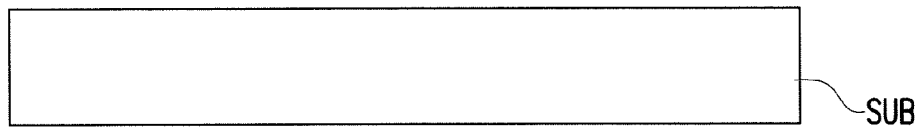
FIG. 2A through FIG. 2N are schematic cross-sectional views showing a manufacturing method of a thin film transistor according to an embodiment of the invention.
Figure 2B:
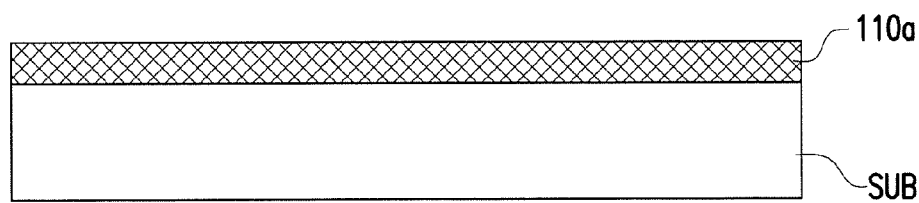
FIG. 2C' is a schematic top view of FIG. 2C.
FIG. 2F' is a schematic top view of FIG. 2F.
FIG. 2H' is a schematic top view of FIG. 2H.
FIG. 2J' is a schematic top view of FIG. 2J.
FIG. 2L' is a schematic top view of FIG. 2L.
FIG. 2M' is a schematic top view of FIG. 2M.
FIG. 2O is a schematic cross-sectional view showing a manufacturing method of the thin film transistor according to another embodiment of the invention.
Figure 2C:
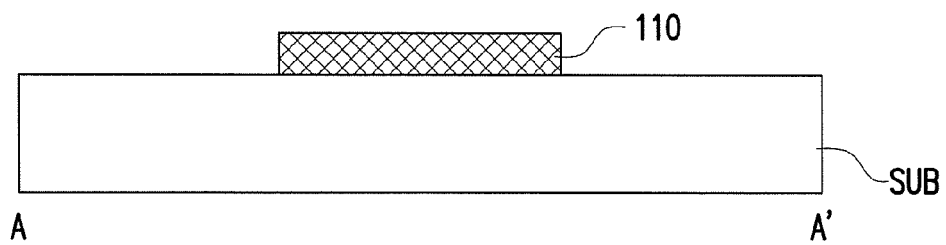
Figure 2C:
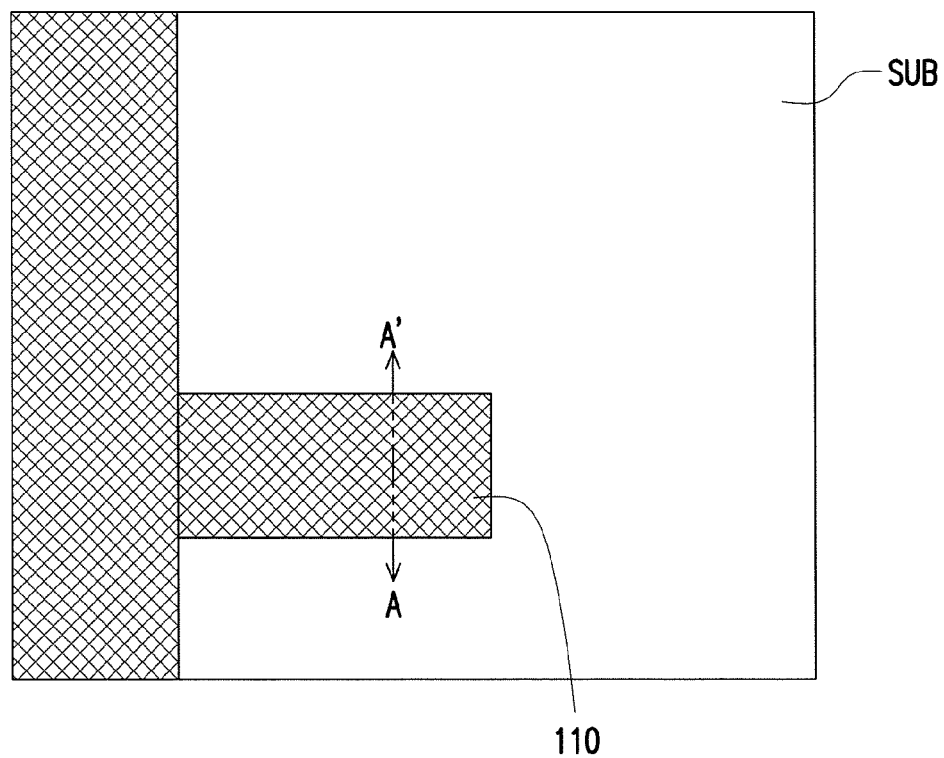
Figure 2D:
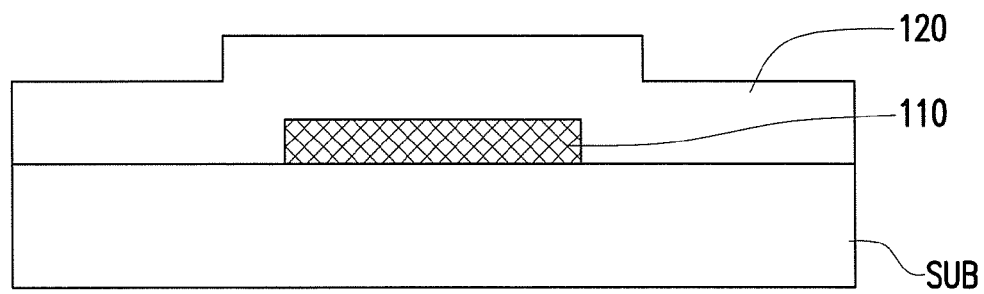
Figure 2E:
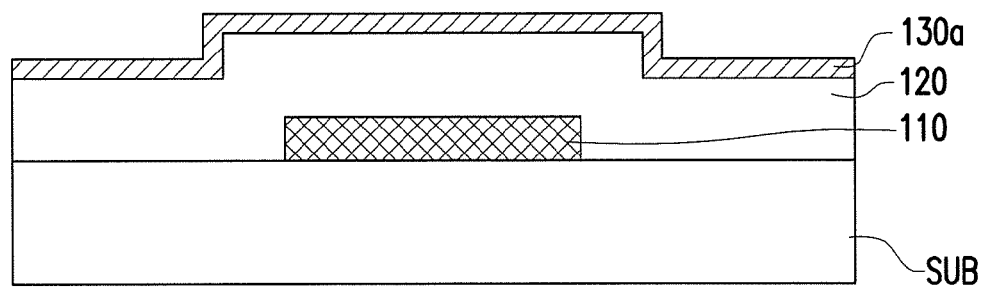
Figure 2F:
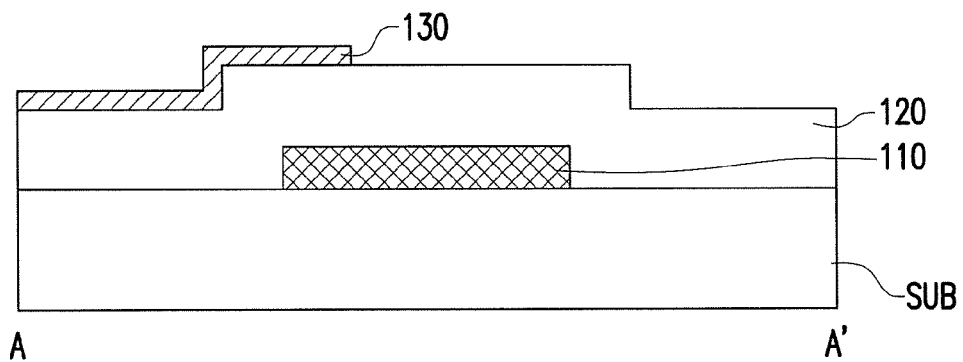
Figure 2F:
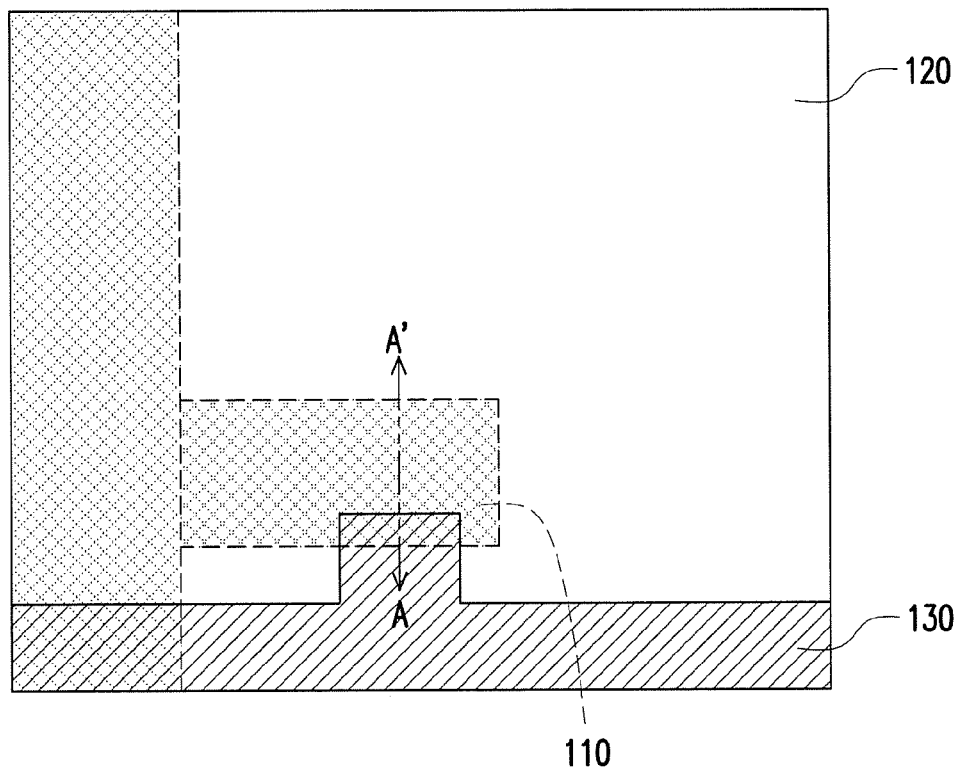
Figure 2G:
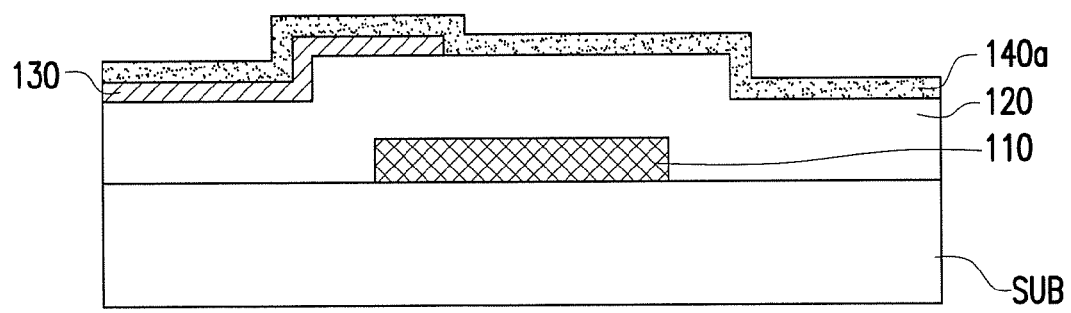
Figure 2H:
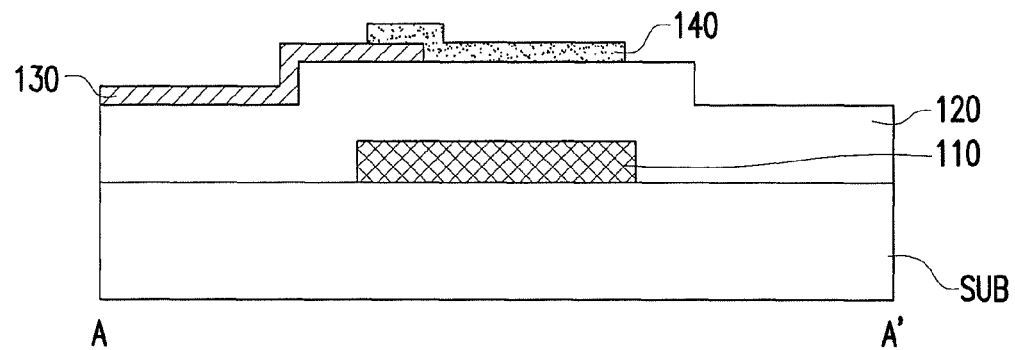
Figure 2H:
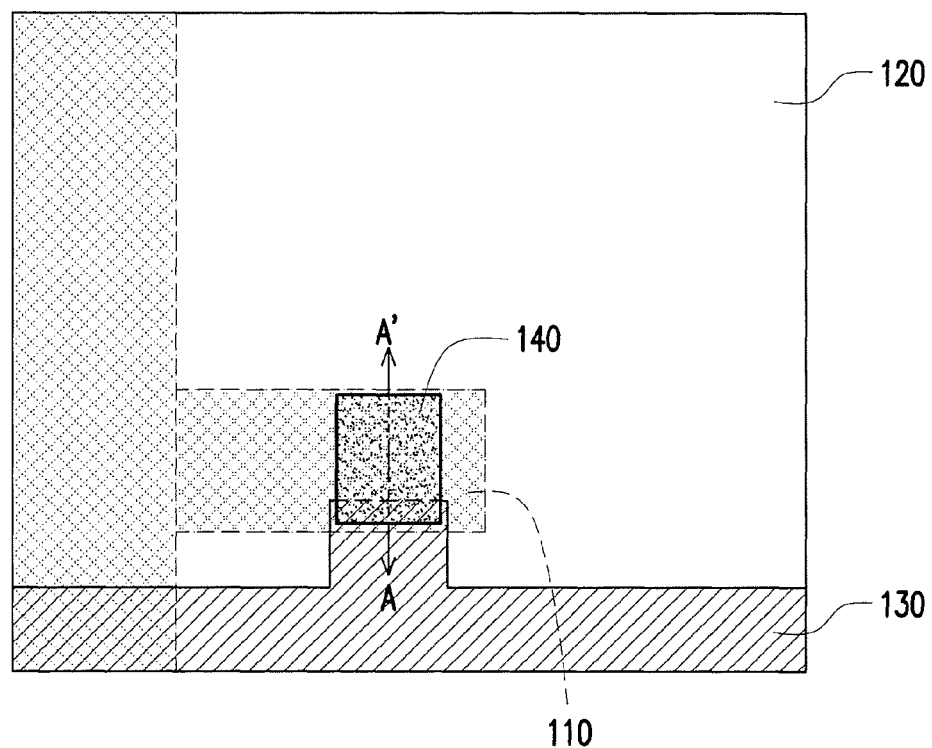
Figure 2I:
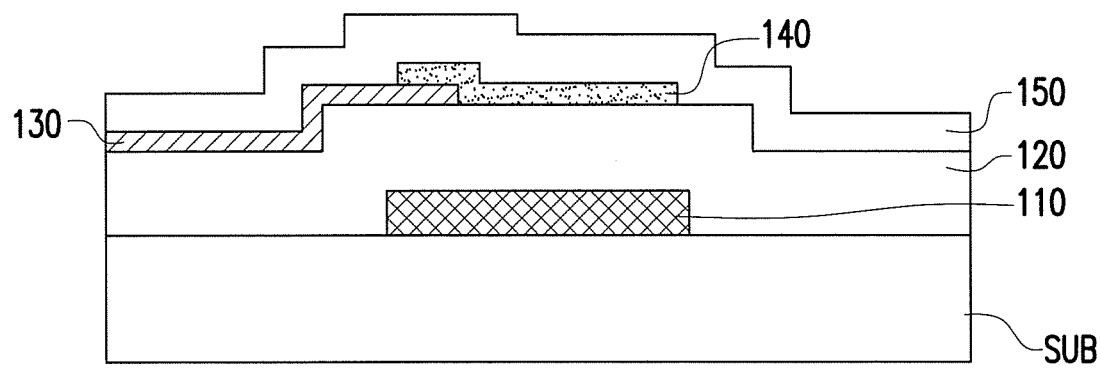
Figure 2J:
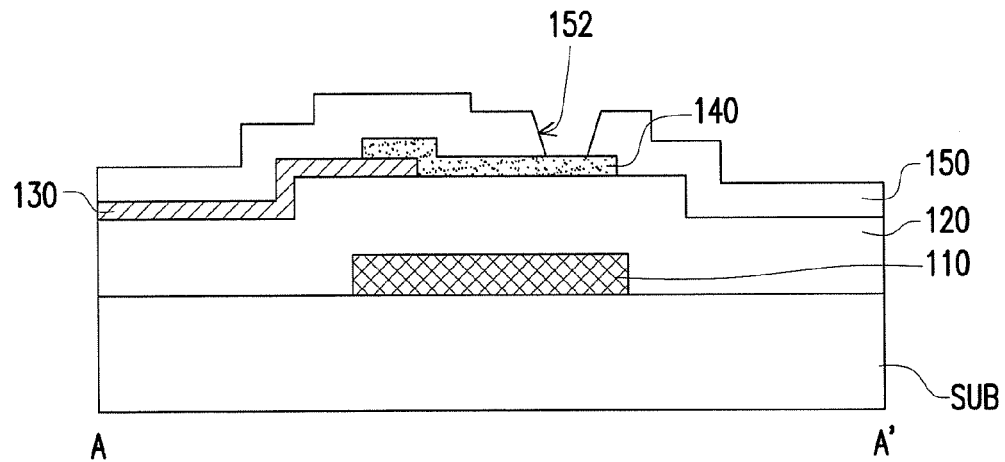
Figure 2J:
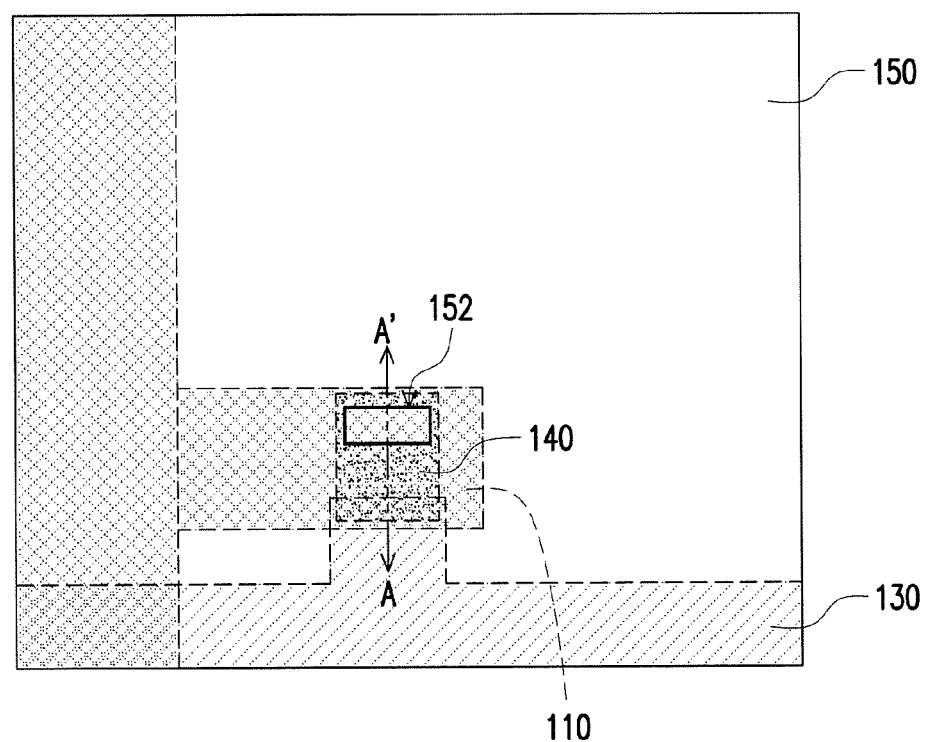
Figure 2K:
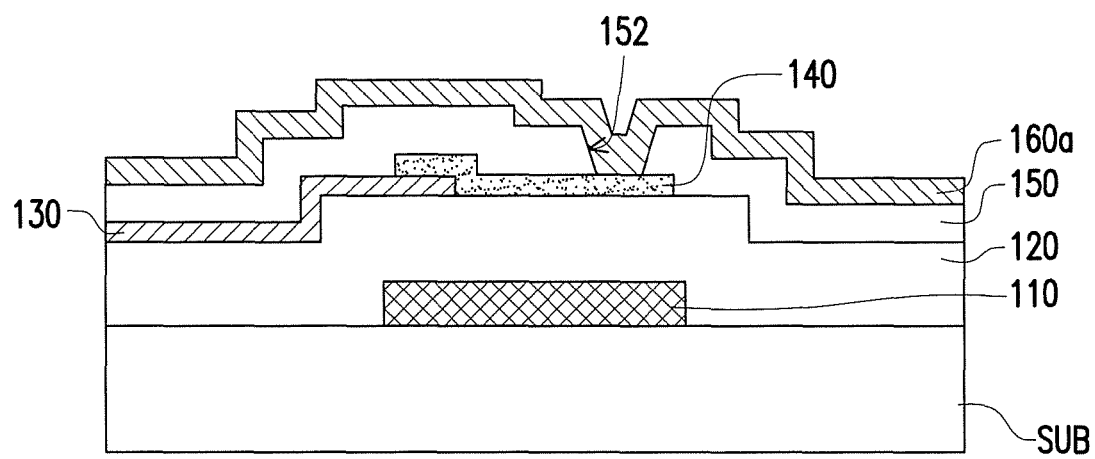
Figure 2L:
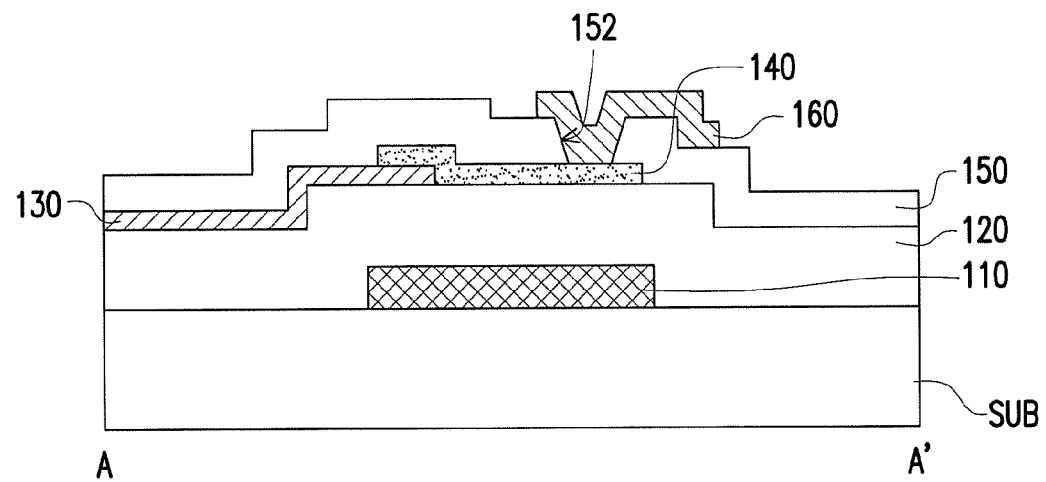
Figure 2L:
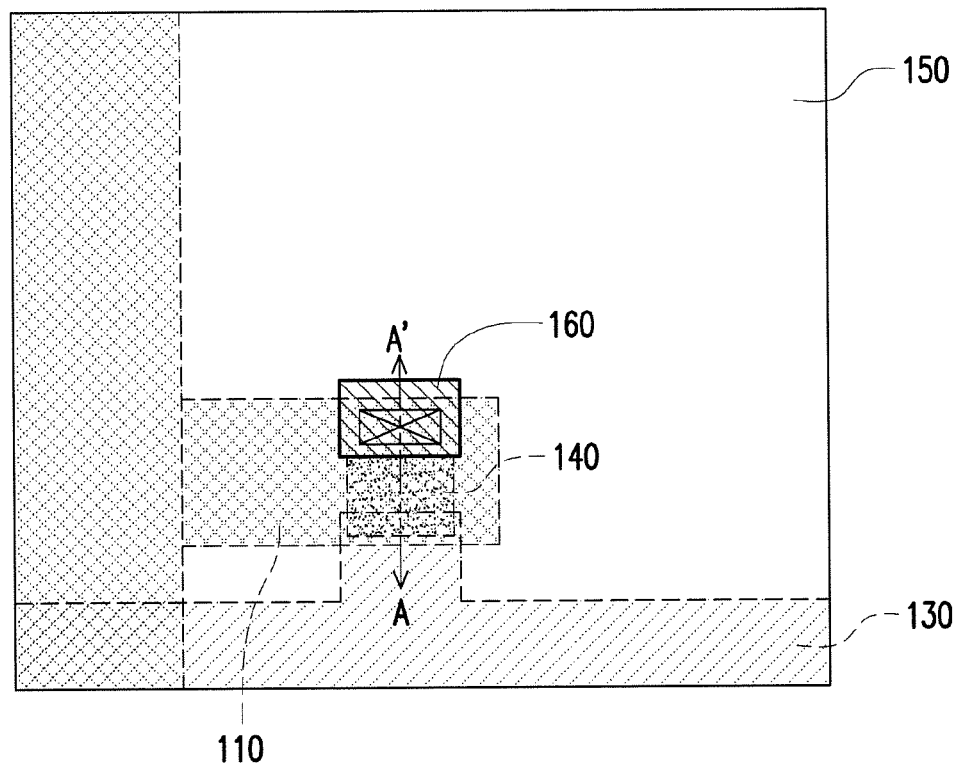
Figure 2M:
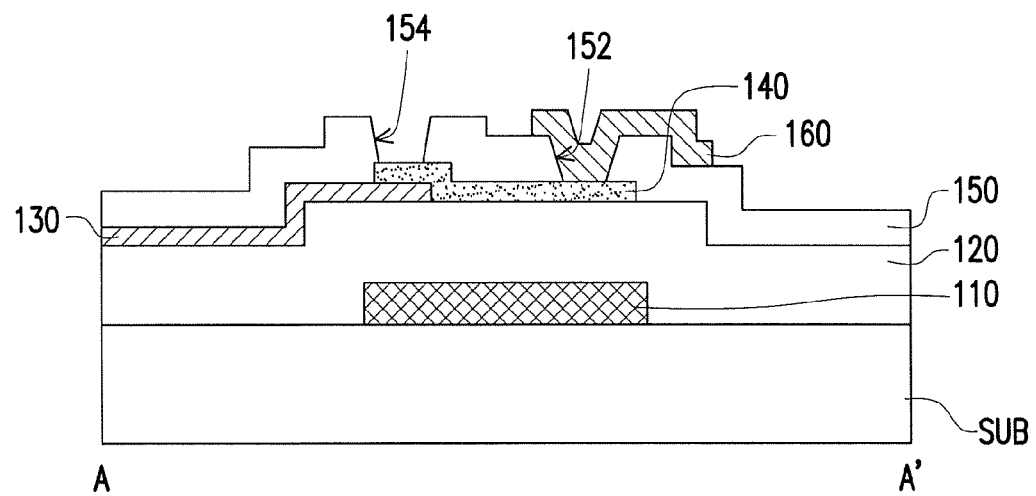
Figure 2M:
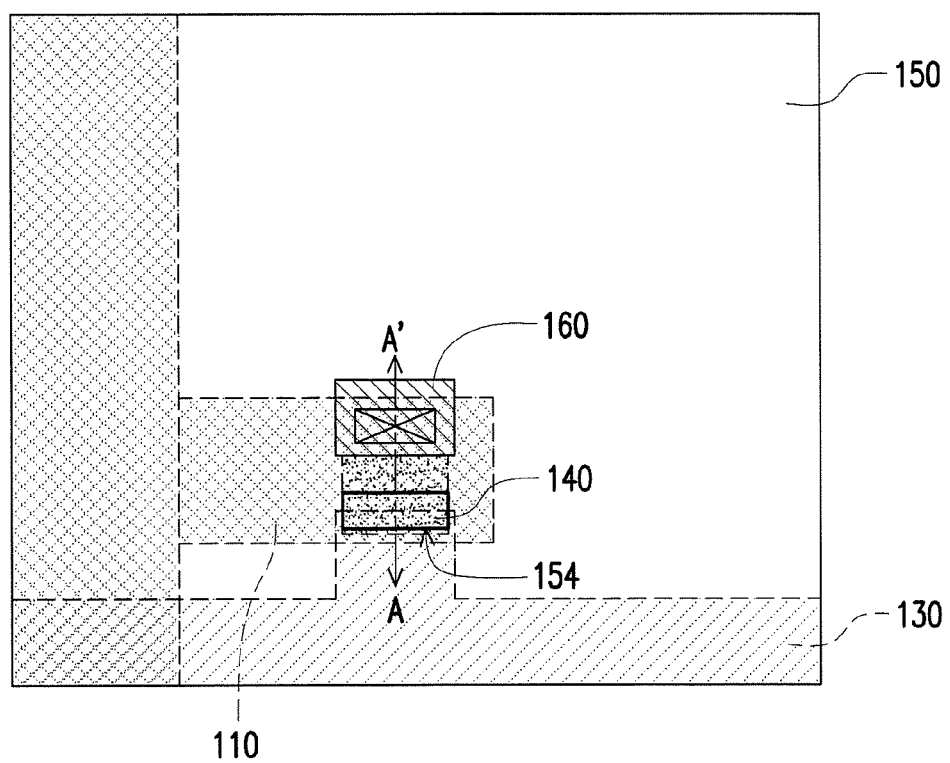
Figure 2N:
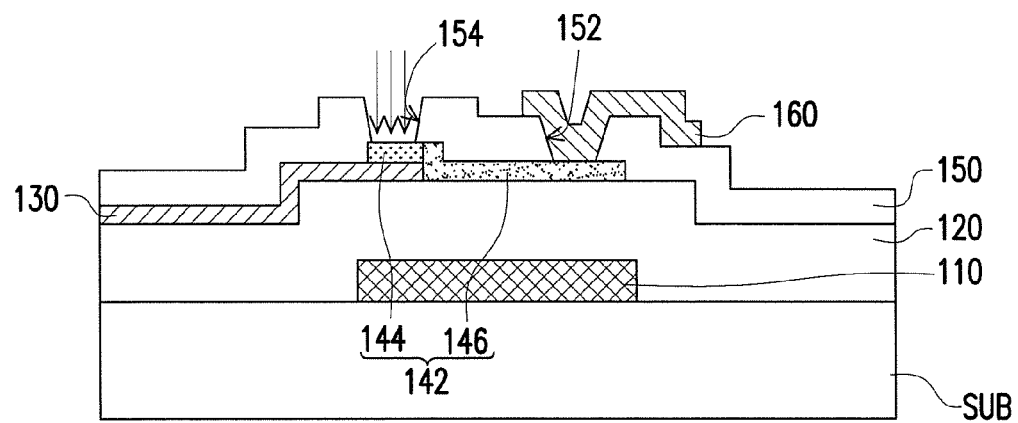

FIG. 2A through FIG. 2N are schematic cross-sectional views showing a manufacturing method of a thin film transistor according to an embodiment of the invention.

First, with reference to FIG. 2A, a substrate SUB is provided. In the present embodiment, a material of the substrate SUB may be an inorganic transparent material, an organic transparent material, an inorganic non-transparent material, an inorganic non-transparent material or the like. For instance, the substrate SUB may be a glass substrate, a plastic substrate or the like, but the substrate SUB of the present embodiment is not limited to be made of the aforementioned material. Additionally, the substrate SUB may be a rigid substrate or a flexible substrate.

Then, with reference to FIG. 2B through FIG. 2C', a gate 110 is formed on the substrate SUB. In the present embodiment, the material of the gate 110, may be a metal, such as titanium, molybdenum, aluminum, an alloy thereof or a staking layer thereof. During manufacture, as shown in FIG. 2B, a gate material layer 110a is first formed on the substrate SUB. The gate material layer 110a may be formed through a physical vapor deposition (PVD) process, such as sputtering or evaporating, or through a chemical vapor deposition (CVD) process. Then, the gate material layer 110a is patterned through a lithography etching process, so as to form a gate 110 shown in FIG. 2C and FIG. 2C', where FIG. 2C is a cross-sectional view, and FIG. 2C' is a top view thereof.

Thereafter, with reference to FIG. 2D, a gate insulation layer 120 is formed on the substrate SUB to cover the gate 110. A material of the gate insulation layer 120 may be SiNx, SiO2 or a stack layer thereof and formed through a CVD process, such as a plasma enhanced chemical vapor deposition (PECVD process) or a PVD process. Certainly, the gate insulation layer 120 is not limited to be formed in the aforementioned manner.

Then, with reference to FIG. 2E through FIG. 2F', a first source/drain 130 is formed on the gate insulation layer 120. A material of the first source/drain 130 may be a metal, such as titanium, molybdenum, aluminum, an alloy thereof or a staking layer thereof. As shown in FIG. 2E, a first source/drain material layer 130a is formed on the gate insulation layer 120. The first source/drain material layer 130a may be formed through a PVD process, such as sputtering or evaporating, or a CVD process. The first source/drain material layer 130a is then patterned through a lithography etching process, so as to form the first source/drain 130 shown in FIG. 2F and FIG. 2F', where FIG. 2F is a cross-sectional view, and FIG. 2F' is a top view thereof.

Furthermore, with reference to FIG. 2G through FIG. 2H', a semiconductor material layer 140 is formed on the gate insulation layer 120 and the first source/drain 130. The semiconductor material layer 140 is located above the gate 110. In the present embodiment, a material of the semiconductor material layer 140 includes a metal oxide semiconductor (MOS), such as indium gallium zinc oxide (IGZO), but the material of the semiconductor material layer 140 is not limited thereto.

During manufacture, as shown in FIG. 2G, a semiconductor material layer 140a is formed entirely on the gate insulation layer 120 and the first source/drain 130. The semiconductor material layer 140a may be formed through a PVD process, such as sputtering or evaporating, or through a CVD process. The semiconductor material layer 140a is then patterned through a lithography etching process, so as to remove the semiconductor material layer 140a outside the region above the gate 110 to form the semiconductor material layer 140 shown in FIG. 2H and FIG. 2H'. The semiconductor material layer 140 is located above part of the gate 110 and part of the first source/drain 130. FIG. 2H is a cross-sectional view, and FIG. 2H' is a top view thereof.

Afterwards, with reference to FIG. 2I through FIG. 2J', a dielectric layer 150 is formed on the first source/drain 130, the gate insulation layer 120 and the semiconductor material layer 140. The dielectric layer 150 has first contact window 152, and the first contact window 152 exposes part of the semiconductor material layer 140. A material of the dielectric layer 150 may be SiNx, SiO2 or a stack layer thereof and formed through a CVD process, such as a PECVD process, or a PVD process, such as sputtering or evaporating. Certainly, the dielectric layer 150 is not limited to be formed in the aforementioned manner.

During manufacture, as shown in FIG. 2I, the dielectric layer 150 is first formed entirely on the first source/drain 130, the gate insulation layer 120 and the semiconductor material layer 140. Then, the dielectric layer 150 is patterned through a process, such as a lithography etching process or a laser etching process, to form the first contact window 152, where FIG. 2J is a cross-sectional view, and FIG. 2J' is a top view thereof. In the present embodiment, the first contact window 152 is located above the gate 110 and on the semiconductor material layer 140.

Furthermore, with reference to FIG. 2K through FIG. 2L', a second source/drain 160 is formed on the semiconductor material layer 140 (more precisely, on the dielectric layer 150) and the gate insulation layer 120. In the present embodiment, a material of the second source/drain 160 may be a metal, such as titanium, molybdenum, aluminum, an alloy thereof or a staking layer thereof. As shown in FIG. 2K, a second source/drain material layer 160a is formed entirely on the dielectric layer 150 and the semiconductor material layer 140. The second source/drain material layer 160a may be formed through a PVD process, such as sputtering or evaporating, or through a CVD process. The second source/drain material layer 160a is patterned through a lithography etching process, so as to form the second source/drain 160 shown in FIG. 2L and FIG. 2L', where FIG. 2L is a cross-sectional view, and FIG. 2L' is a top view thereof. As shown in FIG. 2L, the second source/drain 160 contacts the semiconductor material layer 140 through the first contact window 152 of the dielectric layer 150.

In the present embodiment, the first source/drain 130 is illustrated as a source for example, and the second source/drain 160 is illustrated as a drain for example; however, in other embodiments, the first source/drain 130 of the thin film transistor 100 may also serve as a drain, and the first source/drain 160 may also serve as a source, which are not limited in the invention.

Then, with reference to FIG. 2M and FIG. 2M', the dielectric layer 150 is patterned, such that the dielectric layer 150 forms an opening 154 on an overlapping region of the first source/drain 130 and the semiconductor material layer 140. The overlapping region of the semiconductor material layer 140 and the first source/drain 130 is exposed by the opening 154. The dielectric layer 150 may be patterned through a lithography etching process or a laser etching process, but the invention is not limited thereto.

Further, with reference to FIG. 2N, an electrical conductivity of the semiconductor material layer 140 located on the first source/drain 130 is increased, so as to form a semiconductor layer 142. The semiconductor layer 142 includes a first portion 144 located on the first source/drain 130 and a second portion 146 connected with the first portion 144, and an electrical conductivity of the first portion 144 is higher than that of the second portion 146.

In the present embodiment, a method of forming the first portion 144 includes hydrogenating the semiconductor material layer 140 located on the first source/drain 130 to form a first portion 144 of the semiconductor layer 142. To be more detailed, a hydrogen plasma may be used to hydrogenate the semiconductor material layer 140 located on the first source/drain 130 to form the semiconductor layer 142. The part of the semiconductor material layer 140 located on the first source/drain 130 is exposed from the dielectric layer 150, hydrogenated as the first portion 144 of the semiconductor layer 142 through the action of the hydrogen plasma, and thus, the electrical conductivity of first portion 144 is increased after being hydrogenated. The second portion 146 of the semiconductor layer 140 is prevented from being hydrogenated due to being covered by the dielectric layer 150 and retains the original electrical conductivity. In the present embodiment, a material of the first portion 144 includes a hydrogen-containing MOS, while a material of the second portion 146 includes an MOS.

In the present embodiment, when a turn-on voltage (i.e., a high voltage) is applied to the gate 110, the gate 110 generates an electric field to turn on the semiconductor layer 142. Part of the first source/drain 130 is located between the first portion 144 and the gate 110 of the semiconductor layer 142 to shield part of the electric field; however, the shielding affection caused to the first portion 144 by the first source/drain 130 is reduced as the electrical conductivity of the first portion 144 of the semiconductor layer 142 is increased. Thus, when the turn-on voltage (i.e., the high voltage) is applied to the gate 110, the first portion 144 of the semiconductor layer 142 may be in a turned-on state. Namely, the entire semiconductor layer 142 may function and thereby, improves the issue of poor mobility. In the present embodiment, the electrical conductivity of the first portion 144 is approximately $1 \times 10^4$ to $2 \times 10^4$ times the electrical conductivity of the second portion 146, but the invention is not intended to limit the relation therebetween.

Furthermore, the step of hydrogenating the semiconductor material layer 140 on the first source/drain 130 by using the hydrogen plasma is only one of the methods of forming the first portion 144, and the invention is not intended to limit the method of forming the semiconductor layer 142. In other embodiments, the semiconductor layer 142 may be formed first through the steps shown in FIG. 2A through FIG. 2M' and then through the step shown in FIG. 2N.

Figure 2O:
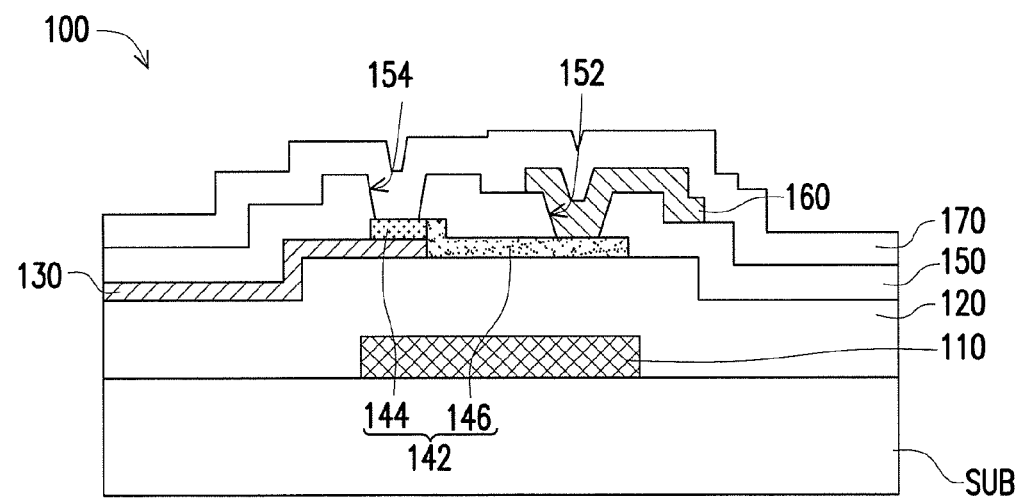

FIG. 2O is a schematic cross-sectional view showing a manufacturing method of the thin film transistor according to another embodiment of the invention. Referring to FIG. 2O, in the present embodiment, a method of forming the first portion 144 includes forming a protecting layer 170 on the first portion 144 and the second source/drain 160 by using a hydrogen-containing gas source to hydrogenate the semiconductor material layer 140 located on the first source/drain 130 during the protecting layer 170 is formed. As shown in FIG. 2O, the protecting layer 170 contacts the first portion 144 of the semiconductor layer 142 through the opening 154 of the dielectric layer 150.

In the present embodiment, a material of the protecting layer 170 may be SiNx, SiO2, or a stack layer thereof, and the protecting layer 170 may be formed through a CVD process, such as PECVD process or a PVD process with a hydrogen-containing gas (e.g., an ammonia gas) flowing in. Certainly, the protecting layer 170 is not limited to be formed in the aforementioned manner.

In one step illustrated in FIG. 2O, two operations are simultaneously performed. One of the operations is to form the protecting layer 170 on the dielectric layer 150, the semiconductor material layer 140 and the second source/drain 160, while the other is to hydrogenate the semiconductor material layer 140 located on the first source/drain 130, so as to define the first portion 144 (i.e., the hydrogenated portion) and the second portion 146 (i.e., the unhydrogenated portion) of the semiconductor layer 142. In the present embodiment, the two operations may be completed in one single step, which contributes to effectively simplifying the manufacturing process and enhancing manufacturing efficiency. Certainly, a manufacturer may also select to perform the step shown in FIG. 2N to first hydrogenate the semiconductor material layer 140 located on the first source/drain 130 by using the hydrogen plasma to form the semiconductor layer 142, and then form the protecting layer 170 on the dielectric layer 150, the semiconductor layer 142 and the second source/drain 160, so as to form a thin film transistor 100 structure shown in FIG. 2O. The sequence of manufacturing the thin film transistor 100 is not limited to the process described above.

As shown in FIG. 2O, the thin film transistor 100 is disposed on the substrate SUB and includes a gate 110, a gate insulation layer 120, a first source/drain 130, a semiconductor layer 142 and a second source/drain 160. The gate 110 is disposed on the substrate SUB. The gate insulation layer 120 covers the gate 110 and the substrate SUB. The first source/drain 130 is disposed on the gate insulation layer 120. The semiconductor layer 142 is disposed above the gate 110, extends from the gate insulation layer 120 to the first source/drain 130 and includes a first portion 144 located on the first source/drain 130 and a second portion 146 connected with the first portion 144. An electrical conductivity of the first portion 144 is higher than that of the second portion 146. The second source/drain 160 covers and contacts the second portion 146.

In the present embodiment, a material of the semiconductor layer 142 includes a MOS. In detail, a material of the first portion 144 includes a hydrogen-containing MOS, such as hydrogen-containing IGZO, and a material of the second portion 146 includes a MOS such as IGZO.

Additionally, the thin film transistor 100 further includes a dielectric layer 150 and a protecting layer 170. The dielectric layer 150 covers the first source/drain 130, the gate insulation layer 120 and the semiconductor layer 142. The dielectric layer 150 has an opening 154 and a first contact window 152. The opening 154 exposes the first portion 144 and the first contact window 152 exposes part of the second portion 146. The protecting layer 170 covers the dielectric layer 150 and the second source/drain 160 and contacts the first portion 144 of the semiconductor layer 142 through the opening 154. The second source/drain 160 contacts the second portion 146 of the semiconductor layer 142 through the first contact window 152 of the dielectric layer 150.

In the structure of the thin film transistor 100 in the present embodiment, the electrical conductivity of the first portion 144 in the semiconductor layer 142 is higher, and thus, the shielding affection caused to the first portion 144 by the first source/drain 130 may be effectively reduced. When a turn-on voltage (i.e., a high voltage) is applied to the gate 110, the first portion 144 of the semiconductor layer 142 may be turned on. Namely, both the first portion 144 and the second portion 146 of the semiconductor layer 142 may be operated, such that the semiconductor layer 142 of the thin film transistor 100 may have higher mobility.

It should be noted that in other embodiments, after the semiconductor material layer 140 shown in FIG. 2H is manufactured, the hydrogenating step may also be directly performed on the semiconductor material layer 140 located on the first source/drain 130 to form the semiconductor layer 142. The semiconductor layer 142 includes the first portion 144 located on the first source/drain 130 and the second portion 146 connected with the first portion 144, and the electrical conductivity of the first portion 144 is higher than the electrical conductivity of the second portion 146. Thereafter, the dielectric layer 150 is formed entirely on the first source/drain 130, the gate insulation layer 120 and the semiconductor layer 142 and then patterned through a through a process, such as a lithography etching process or a laser etching process, to form the first contact window 152. Afterwards, the second source/drain 160 is formed on the dielectric layer 150, and the second source/drain 160 contacts the second portion 146 of the semiconductor layer 142 through the first contact window 152 of the dielectric layer 150.

It is to be mentioned that in the present embodiment, the first portion 144 of the semiconductor layer 142 is hydrogenated and thus, has a higher electrical conductivity. Therefore, the step of forming the opening 154 on the overlapping region of the first source/drain 130 and the semiconductor material layer 140 and then performing the hydrogenating process, as shown in FIG. 2M, is not necessary. By contrast, the dielectric layer 150 directly covers the first portion 144 of the semiconductor layer 142. Then, the protecting layer 170 is formed to cover the dielectric layer 150 and the second source/drain 160. As a plurality of implementation manners has been illustrated above, it is apparent to the manufacturer that the sequence of forming each layer may be adjusted based on demands and is not limited to the sequences set forth in the above embodiments.

Figure 3A:
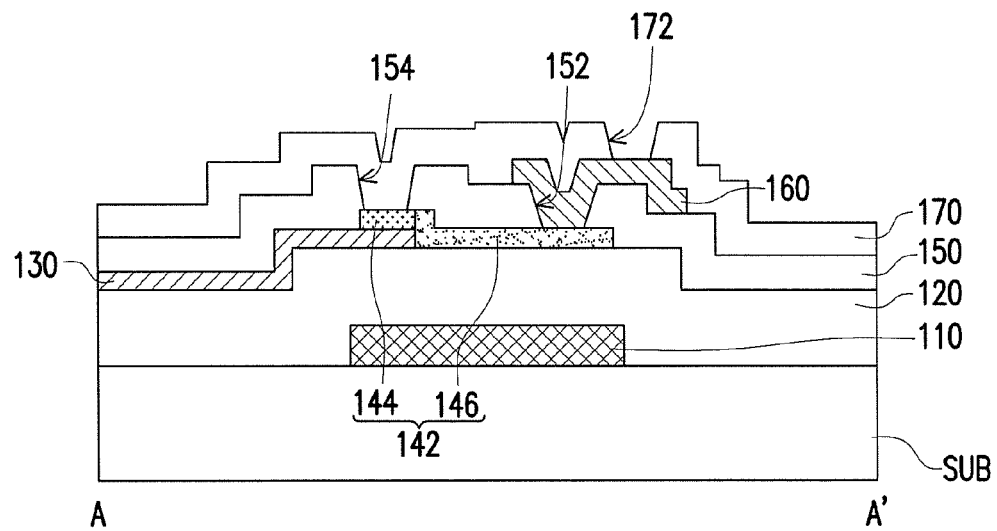
FIG. 3A through FIG. 3C are schematic cross-sectional views showing a manufacturing method of a pixel structure of an embodiment of the invention.
Figure 3A:
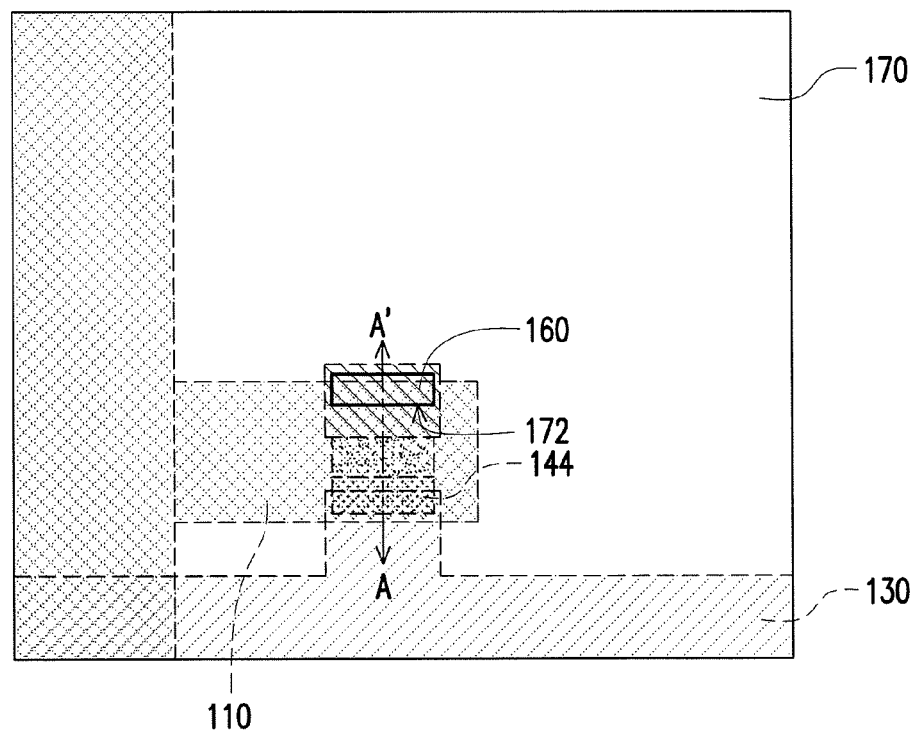
Figure 3B:
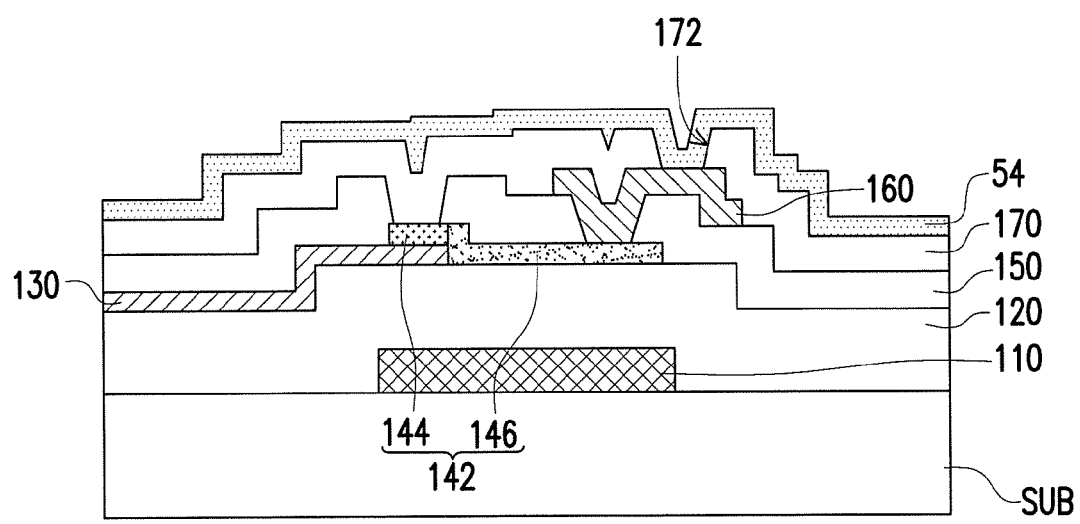
Figure 3C:
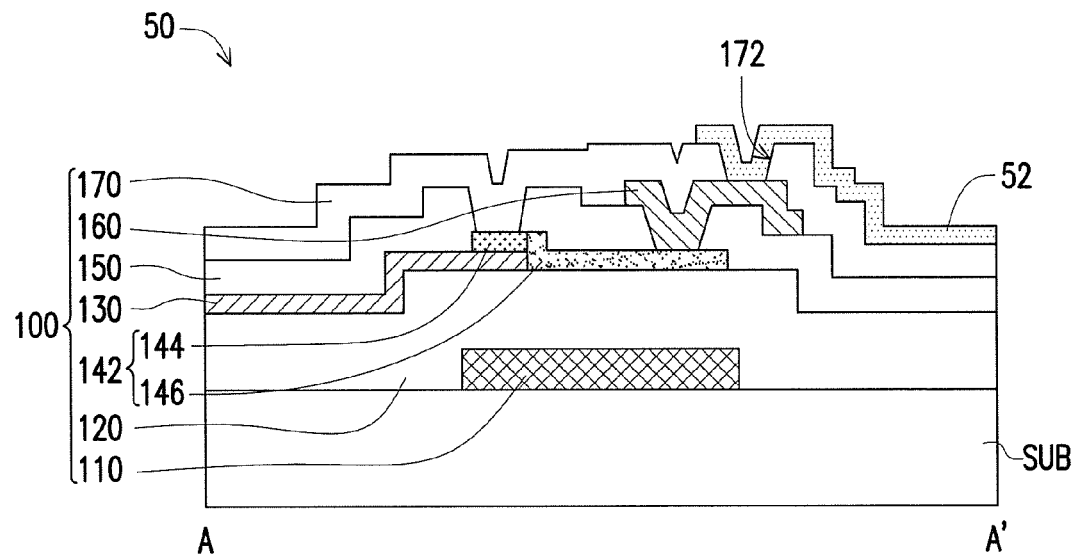
Figure 3C:
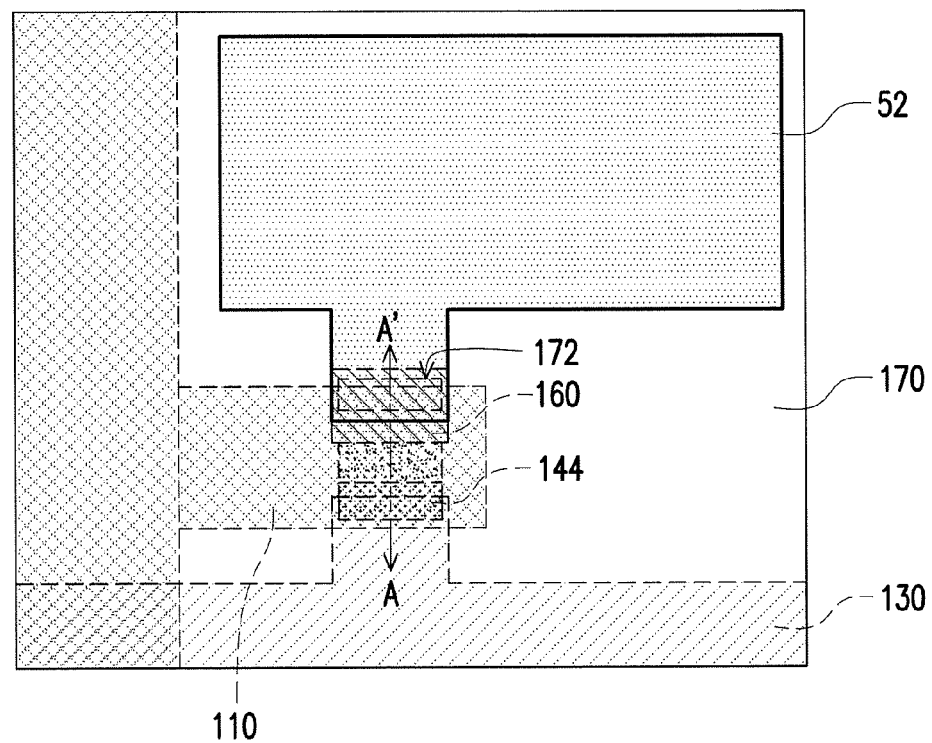

FIG. 3A through FIG. 3C are schematic cross-sectional views showing a manufacturing method of a pixel structure of an embodiment of the invention. In the manufacturing method of a pixel structure of the present embodiment, a thin film transistor 100 may be first manufactured by the manufacturing method of the thin film transistor illustrated in FIG. 2A through FIG. 2N or the manufacturing method of the thin film transistor illustrated in FIG. 2A through FIG. 2M and FIG. 2O. Then, a pixel electrode 52 is further manufactured by the method that will be described hereinafter to produce a pixel structure 50. Certainly, the thin film transistor 100 in the pixel structure 50 is not limited to be formed in the aforementioned manner. Moreover, for conveniently learning the same or similar elements in the FIG. 3A through FIG. 3C', the same element symbols used in FIG. 2A through FIG. 2O are also referred in FIG. 3A through FIG. 3C'.

Referring to FIG. 3A and FIG. 3A', the protecting layer 170 is patterned, so as to form a second contact window 172 on the protecting layer 170, and the second contact window 172 exposes part of the second source/drain 160. The protecting layer 170 may be patterned through a process, such as a lithography etching process or a laser etching process, where FIG. 3A is a cross-sectional view, and FIG. 3A' is a top view thereof.

Then, with reference to FIG. 3B through FIG. 3C', a pixel electrode 52 is formed on the protecting layer 170 and the second source/drain 160, where the pixel electrode 52 contacts the second source/drain 160 through the second contact window 172. In the present embodiment, a material of the pixel electrode 52 is, for example, ITO, but the material of the pixel electrode 52 is not limited thereto. During manufacture, as shown in FIG. 3B, a pixel electrode material layer 54 is formed entirely on the protecting layer 170, extends into the second contact window 172 of the protecting layer 170 to contact the second source/drain 160. The pixel electrode material layer 54 may be formed through a PVD process, such as sputtering or evaporating, or through a CVD process. Then, the pixel electrode material layer 54 is patterned through a lithography etching process to form the pixel electrode 52 shown in FIG. 3C and FIG. 3C' to complete the manufacture of the pixel structure 50, where FIG. 3C is a cross-sectional view, and FIG. 3C' is a top view thereof.

As shown in FIG. 3C, the pixel structure 50 of the present embodiment includes the thin film transistor 100 and the pixel electrode 52. Likewise, the semiconductor layer 142 of the pixel structure 50 of the present embodiment has a higher electrical conductivity through the first portion 144 than that through the second portion 146. Thereby, when the turn-on voltage (i.e., the high voltage) is applied to the gate 110, the shielding affection produced by the first source/drain 130 is mitigated, such that the entire semiconductor layer 142 may be turned on and have higher mobility.

To sum up, during the manufacturing process of the thin film transistor in the invention, the electrical conductivity of the semiconductor material layer located on the first source/drain is increased (e.g., by hydrogenating the semiconductor material layer located on the first source/drain using a hydrogen plasma or by forming a protecting layer on the first portion and the second source/drain using a hydrogen-containing gas source, so as to hydrogenate the semiconductor material layer located on the first source/drain during the manufacturing process of the protecting layer) to form the semiconductor layer. The electrical conductivity of the first portion of the semiconductor layer located on the first source/drain is greater than the electrical conductivity of the second portion, such that when the turn-on voltage (i.e., the high voltage) is applied to the gate, the first portion of the semiconductor layer can also be turned on, so as to enhance the overall mobility of the semiconductor layer.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A manufacturing method of a thin film transistor, comprising following steps:
    forming a gate on a substrate;
    forming a gate insulation layer on the substrate to cover the gate;
    forming a first source/drain on the gate insulation layer;
    forming a semiconductor material layer on the gate insulation layer and the first source/drain, wherein the semiconductor material layer is located above the gate;
    forming a second source/drain on the semiconductor material layer and the gate insulation layer; and
    increasing an electrical conductivity of the semiconductor material layer located on the first source/drain to form a semiconductor layer, wherein the semiconductor layer comprises a first portion located on the first source/drain and a second portion connected with the first portion, and an electrical conductivity of the first portion is higher than an electrical conductivity of the second portion.

2. The manufacturing method according to claim 1, wherein the step of forming the first portion of the semiconductor layer comprises:

hydrogenating the semiconductor material layer located on the first source/drain to form the first portion of the semiconductor layer.

3. The manufacturing method according to claim 1, wherein the step of forming the first portion of the semiconductor layer comprises:

hydrogenating the semiconductor material layer located on the first source/drain by using a hydrogen plasma.

4. The manufacturing method according to claim 1, wherein the step of forming the first portion of the semiconductor layer comprises:

forming a protecting layer on the first portion and the second source/drain by using a hydrogen-containing gas source, so as to hydrogenate the semiconductor material layer on the first source/drain during the process of forming the protecting layer.

5. The manufacturing method according to claim 1, further comprising:

forming a dielectric layer on the first source/drain, the gate insulation layer and the semiconductor layer, wherein the dielectric layer comprises an opening and a first contact window, the opening exposes the first portion, and the first contact window exposes part of the second portion; and forming a protecting layer on the dielectric layer and the second source/drain, wherein the protecting layer contacts the first portion of the semiconductor layer through the opening.

6. The manufacturing method according to claim 1, wherein the electrical conductivity of the first portion is approximately $1\times10^4$ to $2\times10^4$ times the electrical conductivity of the second portion.

\* \* \* \* \*